United States Patent
Wiesbauer et al.

(10) Patent No.: US 6,496,128 B2
(45) Date of Patent: Dec. 17, 2002

(54) SIGMA-DELTA ANALOG-TO-DIGITAL CONVERTER ARRAY

(75) Inventors: Andreas Wiesbauer, Pörtschach (AT); Hubert Weinberger, Soboth (AT); Martin Clara, Villach (AT); Jörg Hauptmann, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/001,022

(22) Filed: Nov. 2, 2001

(65) Prior Publication Data

US 2002/0093441 A1 Jul. 18, 2002

Related U.S. Application Data

(63) Continuation of application No. PCT/DE00/01325, filed on Apr. 27, 2000.

(30) Foreign Application Priority Data

May 5, 1999 (DE) .......................... 199 20 738

(51) Int. Cl.[7] .................................. H03M 3/00
(52) U.S. Cl. ........................ 341/143; 341/155
(58) Field of Search ........................ 341/143, 155, 341/161

(56) References Cited

U.S. PATENT DOCUMENTS

| | | | |
|---|---|---|---|
| 5,061,928 A | 10/1991 | Karema et al. | 341/143 |
| 5,274,374 A * | 12/1993 | Powell et al. | 341/143 |
| 5,283,578 A * | 2/1994 | Ribner et al. | 341/118 |
| 5,446,460 A * | 8/1995 | Cabler | 341/143 |
| 5,500,645 A * | 3/1996 | Ribner et al. | 341/118 |
| 5,629,701 A | 5/1997 | Ritoniemi et al. | 341/143 |
| 5,648,779 A * | 7/1997 | Cabler | 341/118 |
| 5,682,160 A | 10/1997 | Ribner et al. | 341/143 |
| 5,736,950 A | 4/1998 | Harris et al. | 341/143 |
| 6,323,794 B1 * | 11/2001 | Okuda et al. | 341/143 |

FOREIGN PATENT DOCUMENTS

| | | | |
|---|---|---|---|
| DE | 689 15 700 | 9/1994 | H03M/3/02 |
| DE | 691 23 366 | 3/1997 | H03M/3/02 |
| EP | 0 450 951 | 10/1991 | H03M/3/04 |
| EP | 0 586 021 | 3/1994 | H03M/3/04 |

OTHER PUBLICATIONS

*ICASSP* 89:1286–89 vol. 2, "Implementation Considerations and Limitations for Dynamic Range Enhanced Analog to Digital Converters".

* cited by examiner

*Primary Examiner*—Peguy JeanPierre
(74) *Attorney, Agent, or Firm*—Marshall, Gerstein & Borun

(57) ABSTRACT

A sigma-delta analog-to-digital converter array including two cascaded sigma-delta modulators, the two sigma-delta modulators being multi-bit sigma-delta modulators. The sigma-delta analog-to-digital converter array is preferably a third order device and supplies a digital output signal corresponding to a sigma-delta converter with 7-bit quantization. To this end, a second order sigma-delta modulator with 3-bit quantization and a first order sigma-delta modulator with 5-bit quantization may be used.

13 Claims, 4 Drawing Sheets

| Sigma-delta converter type | Supply current | effective surface | $f_{CLK}$/OSR | max. SNR |
|---|---|---|---|---|
| First order one-bit | 100 mA | 1.6 mm² | 52 MHz/24 | 90 dB |
| Second order multi-bit | 80 mA | 20 mm² | 20 MHz/8 | 89 dB |
| Third order multi-bit | 50 mA | 2.6 mm² | 26 MHz/12 | 86 dB |

SIGMA-DELTA ANALOG-TO-DIGITAL CONVERTER ARRAY

RELATED APPLICATIONS

This continuing patent application claims priority under 35 U.S.C. §120 from International Application Serial No. PCT/DE00/01325, which was filed on Apr. 27, 2000.

FIELD OF INVENTION

The present disclosure relates to a sigma-delta analog-to-digital converter array and, in particular, a cascaded two-stage sigma-delta analog-to-digital converter.

BACKGROUND OF INVENTION

Many xDSL applications require analog-to-digital converters (abbreviated as AD converters hereafter) with a high resolution and good bandwidth. In this connection, what are known as pipeline architectures are used with several flash AD converters. Pipeline architectures of this type permit very high bandwidths and correspondingly high sampling rates with good signal resolution. As a rule, however, pipeline architectures need automatic calibrating mechanisms which have to be provided on the same chip as the AD converter array and therefore increase the complexity of the circuit and the size of silicon junction needed.

Consequently, it is an advantage to use sigma-delta converters, which are capable of achieving a higher dynamic range by oversampling, although this usually results in a reduced signal bandwidth. In order to increase the available signal bandwidth without increasing the sampling rate, it is therefore necessary to reduce the oversampling rate (OSR). Satisfactory operation at low oversampling rates is only possible if the quantization noise induced by the quantizers used in sigma-delta converters is a sufficiently low.

However, the one-bit quantizers used in one-bit sigma-delta converters generate relatively high quantization errors and it is only with great difficulty that a good signal-to-noise ratio can be achieved with a one-bit sigma-delta converter at a low oversampling rate. Furthermore, although they require only a small silicon junction, one-bit sigma-delta converter architectures need powerful supply currents because of the relatively high sampling rates.

On the other hand, multi-bit sigma-delta converter architectures, which are basically slightly larger than one-bit sigma-delta architectures, consume significantly less current, since they enable lower sampling frequencies. By using a multi-bit feedback, a high signal-to-noise ratio can be achieved at only low oversampling rates. Multi-bit sigma-delta converters can therefore be used in all applications that require both high resolution and a high converter speed. Hence, multi-bit sigma-delta converters bridge the gap between the flash converters mentioned above, which enable high speeds with limited resolution, and one-bit sigma-delta converters, which permit high resolution at average speeds.

Various aspects of operating a high-performance multi-bit sigma-delta converter pose a challenge. One of these aspects is the problem of developing an architecture that will enable efficient operation of the internal AD and digital-to-analog or digital/analog (DA) converters of the sigma-delta converter in terms of junction surface area. Since the DA and AD converters are usually connected in series within the feedback loop of the corresponding sigma-delta converter architecture, the maximum permissible conversion time for each converter corresponds to only half the clock time. Consequently, applications that are efficient in terms of surface area (e.g., pipeline structures) cannot be used for internal AD converters because of their natural latency or natural reaction time.

Conventional single-stage, multi-bit sigma-delta converters with internal quantization higher than 5 bit, for example, also present a disadvantage in terms of the silicon junction required although they offer considerable advantages in terms-of power consumption.

Another problem inherent in multi-bit sigma-delta converter architectures is the fact that these architectures must necessarily have one or more multi-bit DA converters in the feedback loop but a multi-bit feedback of this type gives rise to problems of linearity.

In order to solve this problem, it was proposed in "An Improved Sigma-Delta Modulator Architecture", T. C. Leslie and B. Singh, IEEE Proceedings ISCAS '90, pages 372–375, May 1990, that the lower-value bits be clipped from the multi-bit output signal of the AD converter and only the highest value bit be applied to the feedback loop, which means only having to use a one-bit DA converter in the feedback branch. The lower-value bits are digitally processed and combined with the output signal of the sigma-delta converter in order to minimise any errors in the feedback signal which might be incurred as a result of clipping the lower-value bits.

Another way of reducing quantization noise when using multi-bit sigma-delta converter architectures is to use several sigma-delta converter stages connected in a cascaded array. With cascaded sigma-delta converter architectures of this type, the quantization errors of one stage are processed in the subsequent stage and the digital output signals of the individual stages are digitally processed in order to suppress noise. Cascaded sigma-delta converters are also known as MASH sigma-delta converters.

FIG. 5 shows a simplified block diagram of a cascaded, two-stage sigma-delta converter architecture of this type, specifically of the type described in "A 50 MHz Multibit Sigma-Delta Modulator for 12b 2 MHZ A/D Conversion", B. P. Brandt, B. A. Wolley, IEEE Journal of Solid-State Circuits, vol. 26, December 1991. This architecture comprises two sigma-delta converter stages or sigma-delta modulators 1 and 2 connected in a cascaded array, the first converter stage 1 corresponding to a second-order one-bit sigma-delta converter and the second converter stage 2 to a first-order multi-bit sigma-delta converter. Accordingly, as illustrated in FIG. 5, the first converter stage 1 comprises two integrators 6, 9 in the form of SC-Filters (switched capacitor), which are disposed together with a 1-bit AD converter 10 in the forward path of the first converter stage 1. As is usually the case with sigma-delta converters, the digital output signal of the 1-bit AD converter 10 is applied to adders 4 and 7 via a 1-bit DA converter 11 in the feedback branch in such a way that the respective difference between the output signal of the 1-bit AD converter 10 and the corresponding signal in the forward path is applied to the integrators 6 and 9. Via an adder 16, the second converter stage 2 receives as an input signal the differential signal between the analog output signal of the 1-bit DA converter 11 and the input signal of the 1-bit AD converter 10 (i.e., the quantization error induced by 1-bit quantization is applied to the second converter stage 2). The structure of the second converter stage 2 corresponds to a single-stage 3-bit sigma-delta converter and accordingly comprises an adder 18, an integrator 20, a 3-bit AD converter 21. and a 3-bit DA converter 22, connected as illustrated in FIG. 5. The output signals supplied by the two converter stages 1 and 2 are digitally processed by a noise suppression logic 3 so that a digital output signal Y(z) corresponding to the analog input signal X(z) is emitted. Each of the integrators 6, 9 and 20 may be provided in the form of SC filters and are represented by the transfer function $1/(1-z^{-1})$ or $z^{-1}/(1-z^{-1})$, for example.

In the circuit illustrated in FIG. 5, the high sensitivity in terms of the accuracy of the DA converters in the feedback branch, which limits the linearity and resolution of the sigma-delta converter architecture, is reduced only by dint of the fact that a multi-bit quantizer is used in the second converter stage 2 while the more critical quantizer of the first converter stage 1 is a one-bit quantizer.

In the publication "A Cascaded Sigma-Delta Pipeline A/D Converter with 1.25 MHz Signal Bandwidth and 89 dB SNR", T. L. Brooks, D. H. Robertson, D. F. Kelly, A. Del Muro, S. W. Harston, IEEE Journal of Solid-State Circuits, vol. 32, pages 1896–1906, December 1997, a variant of this cascaded sigma-delta converter architecture is proposed, whereby a sigma-delta converter stage is connected in a cascaded array with a pipeline AD converter. The sigma-delta converter stage corresponds in particular to a second order sigma-delta converter with 5-bit quantization while the pipeline AD converter structure is designed in four stages. The lower-value bits of the output signal of the pipeline AD converter are used to estimate the quantization error of the 5-bit quantizer of the sigma-delta converter stage and are combined with the time-delayed output signal of the sigma-delta converter stage to obtain a digital output signal which corresponds to the output signal of a second order sigma-delta converter with 12-bit quantization. The disadvantage of this architecture, however, is that the second stage has to be set up in the form of a pipeline AD converter, which means that operation of a third order converter architecture or higher would lead to reduced system stability. This sigma-delta converter architecture is tantamount to an extension of the architecture proposed by T. C. Leslie and B. Singh.

SUMMARY OF THE INVENTION

The present disclosure proposes a new type of sigma-delta array that represents an excellent compromise between the effective size of the silicon junction required by the circuit on the one hand and energy consumption on the other.

Disclosed is a sigma-delta analog-to-digital converter array that includes at least sigma-delta converter stages. Each of the sigma-delta converter stages includes an analog-to-digital converter disposed in a forward path of the sigma-delta converter stage and at least one analog-to-digital converter arranged in a feedback path of the sigma-delta converter stage. The at least two sigma-delta converter stages are connected in a cascaded array such that an analog input signal to be converted into a digital output signal is applied to an input of a first sigma-delta converter stage of the at least two sigma-delta converter stages. An analog differential signal corresponding to a difference between a digital-to-analog-converted output signal of the analog-to-digital converter of the first sigma-delta converter stage and an input signal to the analog-to-digital converter of the first sigma-delta converter stage is input to a second sigma-delta converter stage of the at least two sigma-delta converter stages. Furthermore, the digital output signal corresponds to the analog input signal and is obtained by combining the output signals of the respective analog-to-digital converters of the at least two sigma-delta converter stages. Moreover, the analog-to-digital converter of the first sigma-delta converter stage as well as the digital-to-analog converter are multi-bit converters. Similarly, the analog-to-digital and digital-to-analog converters of the second sigma-delta converter stage are also multi-bit converters. Finally, the sigma-delta converter analog-to-digital converter array is configured as a third order sigma-delta analog-to-digital converter.

DETAILED DESCRIPTION OF PREFERRED EMBODIMENTS

Figure 1:
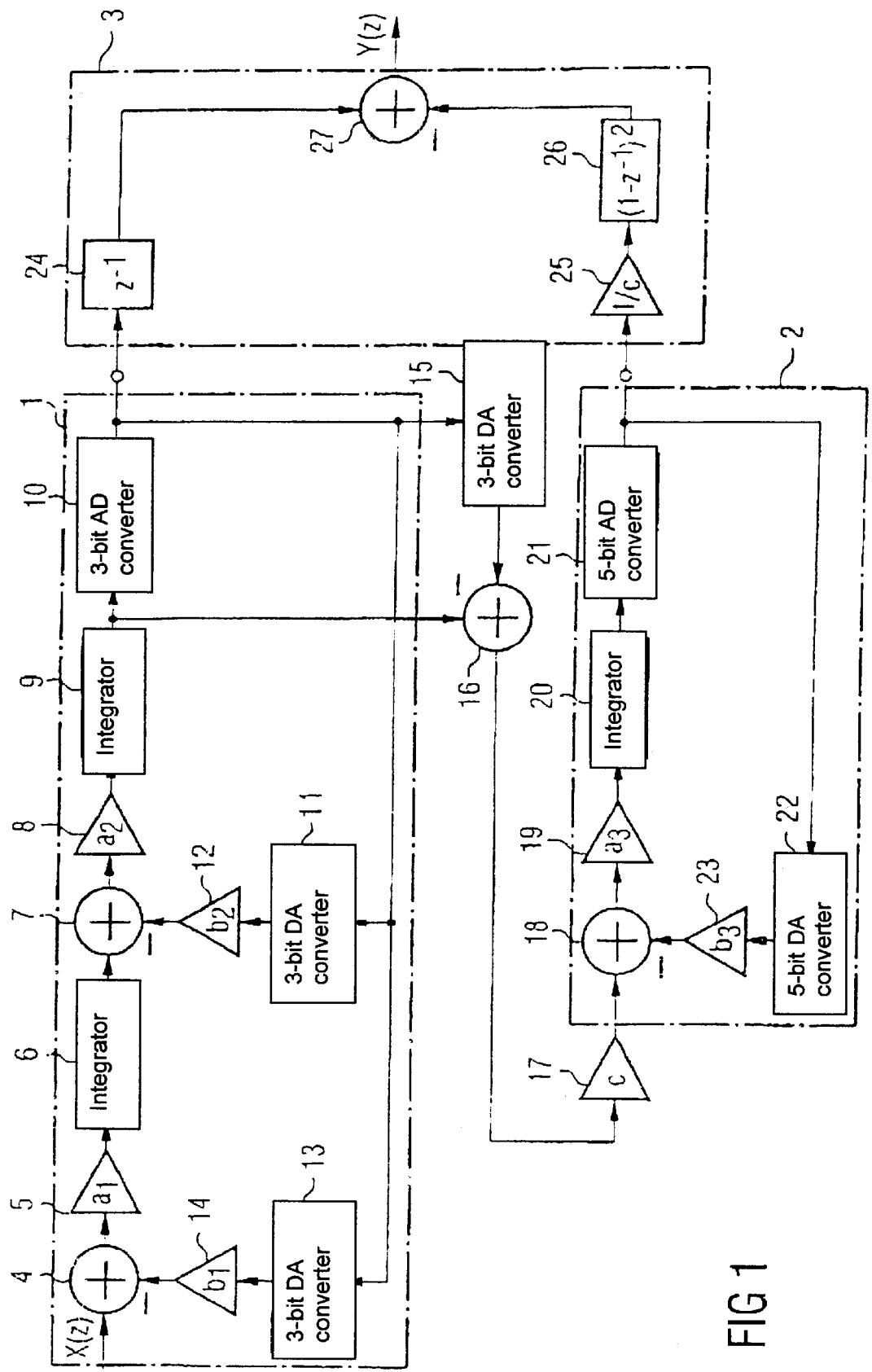
FIG. 1 shows a block diagram of a sigma-delta analog-to-digital converter array in accordance with the teachings of the invention.

The sigma-delta analog-to-digital converter array illustrated in FIG. 1 is a high-resolution sigma-delta analog-to-digital converter architecture designed to operate at low oversampling rates, being clocked at a sampling rate of 26 MHz, and can be made using a 0.6 μm standard CMOS process. As will be explained in more detail below, this sigma-delta analog-to-digital converter array is capable of achieving a signal-to-noise ratio of 86 dB at a signal bandwidth of 1.1 MHz.

In xDSL applications, it is necessary to use inexpensive high-performance converters with low energy consumption. Furthermore, an analog signal bandwidth of 1.1 MHz requires 14-bit resolution. Although a large signal bandwidth can be achieved using the pipeline analog-to-digital converter described above, the dynamic range is limited. Consequently, a cascaded sigma-delta converter is used in the architecture illustrated in FIG. 1, in which two sigma-delta converter stages are connected in cascaded array. By using a multi-stage sigma-delta converter, the desired quantization resolution is divided between the individual converter stages.

The present sigma-delta converter is preferably operated at a relatively low oversampling rate (OSR) (for example OSR=12) in order to keep the sampling rate and hence energy consumption as low as possible. In order to be able to achieve the desired resolution specified above, a second or third order sigma-delta converter can be used in this instance. A second order sigma-delta converter requires internal 9-bit quantization in order to achieve the desired resolution while internal 7-bit quantization will suffice for this purpose in a third order sigma-delta converter. Higher order sigma-delta converters do not bring any further improvement under these low oversampling conditions.

The resolution of the internal quantization essentially determines the silicon junction needed by the architecture as a whole. Since a low bit width is needed for quantization when using a third order sigma-delta converter, this configuration was selected for the embodiment illustrated in FIG. 1.

Figures 2, 3:
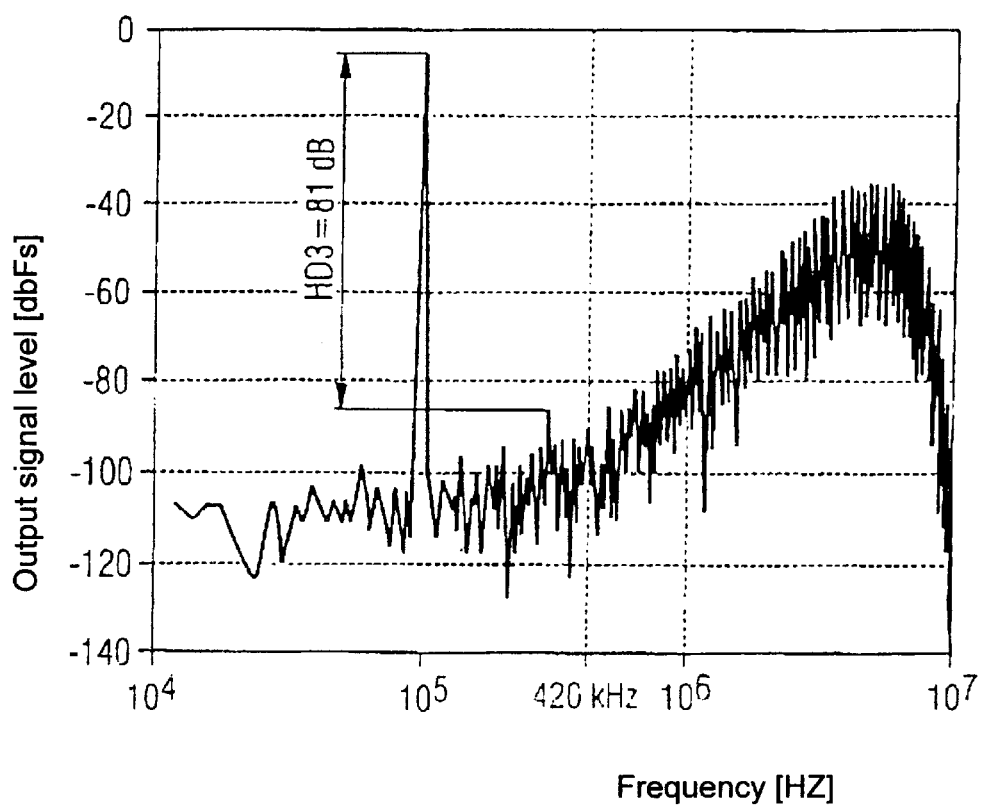
FIG. 2 is a table illustrating how the architecture illustrated in FIG. 1 compares with other known architectures.
FIG. 3 is a graph showing the measured output spectrum of the architecture illustrated in FIG. 1.

FIG. 2 gives a comparison of different types of sigma-delta converters in terms of supply current, the respective effective silicon junction, sampling frequency $f_{CLK}$, oversampling rate OSR and signal-to-noise ratio SNR which can be achieved for similar resolutions and similar signal bandwidths. The one-bit sigma-delta converter shown on the first row in FIG. 2 corresponds to the architecture proposed by T. C. Leslie and B. Singh while the sigma-delta converter shown in the second row in FIG. 2 corresponds to the architecture proposed by T. L. Brooks, D. H. Robertson, D. F. Kelly, A. Del Muro and S. W. Harston. The last row of FIG. 2 details a multi-bit sigma-delta converter of the type proposed by the present disclosure according to the teachings of the invention. As may be seen from the table given in FIG. 2, using multi-bit sigma-delta converters significantly increases surface requirements while using one-bit sigma-delta converters requires higher sampling frequencies and, therefore, results in higher energy consumption.

Figure 5:
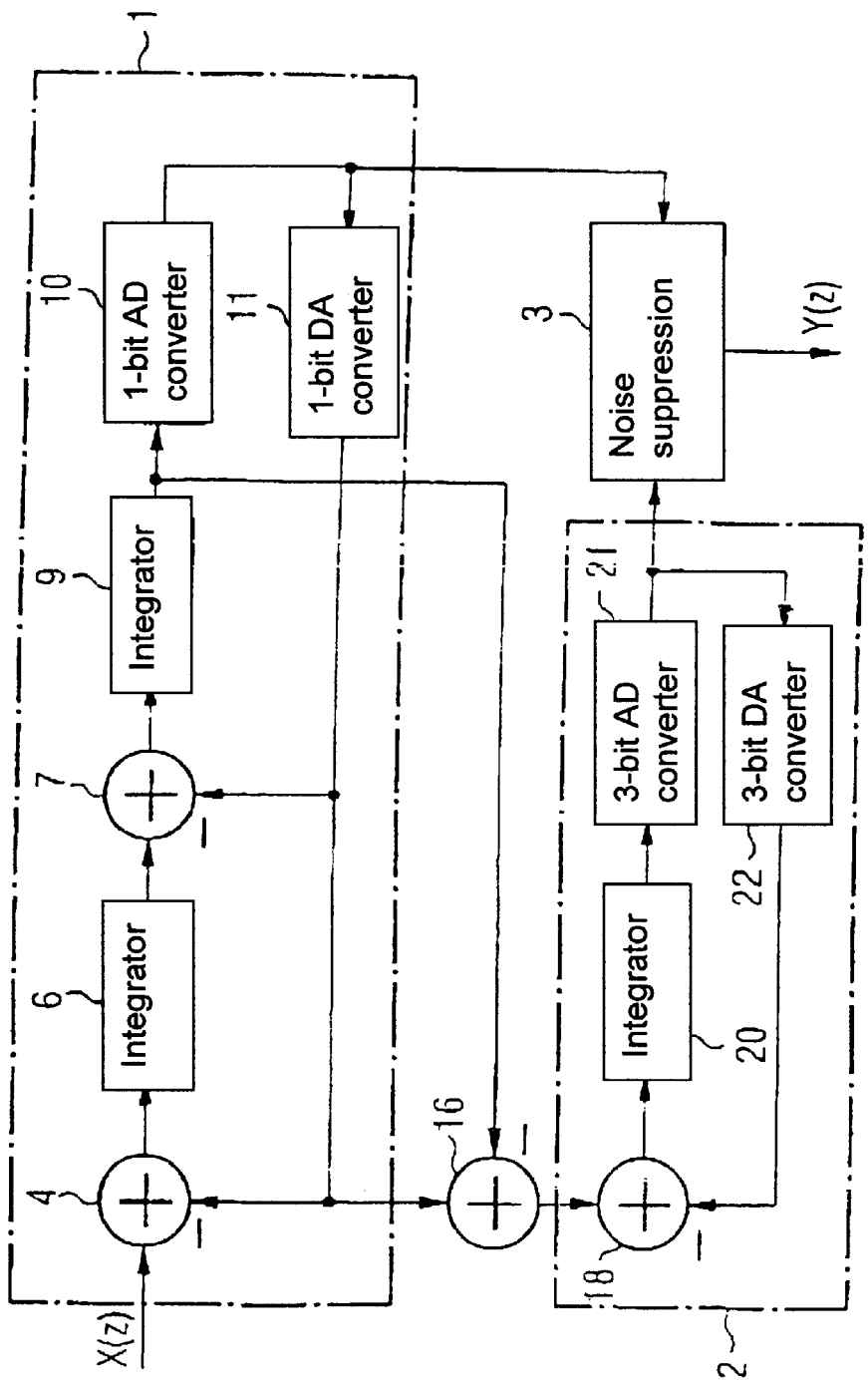
FIG. 5 illustrates a sigma-delta analog-to-digital converter array known in the prior art.

The sigma-delta converter illustrated in FIG. 1 includes at least two sigma-delta converter stages 1, 2, the digital output signals of which are combined and processed by means of a noise suppression logic 3. The first sigma-delta converter stage 1 corresponds to a second order sigma-delta converter or sigma-delta modulator with 3-bit quantization and receives an input signal X(z) to be digitized. As illustrated in FIG. 1, the first sigma-delta converter stage 1 comprises connected integrators 6, 9, adders 4, 7, a 3-bit AD converter 10 and, in the feedback branches, 3-bit DA converters 11, 13. Components which are the same as those discussed in relation to FIG. 5 are shown by the same reference numbers and reference may be also made to the description relating to FIG. 5. Arranged between the individual components are buffers or amplifiers 5, 8, 12 and 14 with respective amplification factors $a_1$, $a_2$, $b_2$ and $b_1$.

The second sigma-delta converter stage 2 corresponds to a first order 5-bit sigma-delta converter and comprises an adder 18, an integrator 20, a 5-bit AD converter 21, a 5-bit DA converter 22 and amplifiers 19 and 23 with respective amplification factors $a_3$ and $b_3$. As may be seen from FIG. 1, the quantization error of the first sigma-delta converter stage 1 is applied to the second sigma-delta converter stage 2 via another 3-bit DA converter 15 and an adder 16 as well as an amplifier 17 having an amplification factor c. The three 3-bit DA converters 11, 13 and 15 illustrated in FIG. 1 may clearly be replaced by a single 3-bit DA converter arranged in the feedback branch of the first sigma-delta converter stage 1 similar to DA converter 11 as illustrated in FIG. 5, provided the circuit is modified, accordingly. Irrespective of the specific configuration, an analog differential signal corresponding to a difference between a digital-to-analog converted output signal of the 3-bit AD conveter 10 (e.g,. via 3-bit DA converter 15) and the signal input to the 3-bit AD converter 10 is applied (via adder 16 and amplifier 17) to the second sigma-delta converter stage 2.

As mentioned above, the digital output signals generated by the two sigma-delta converter stages 1, 2 are applied to a noise suppression logic 3. By means of an amplifier 25, the noise suppression logic 3 evaluates the output signal of the second sigma-delta converter stage 2 with the inverse coupling amplification factor of the amplifier 17 (i.e., 1/c) and subjects the evaluated digital output signal to a digital filtering process, the digital filter 26 used for this purpose having the transfer function $(1-z^{-1})^2$, for example. The output signal of the second sigma-delta converter stage 2, filtered and evaluated with 1/c, is subtracted (adder 27) from the output signal of the first sigma-delta converter stage 1, which is delayed in time by a delay element 24, in order to eliminate the quantization error of the first sigma-delta converter stage 1 so that the desired digital output signal Y(z) is output, corresponding to the output signal of a third order sigma-delta converter with internal 7-bit quantization.

In the context of multi-stage sigma-delta converters, leak noise is known to be a critical factor which limits performance capacity. What is meant by leak noise is the quantization noise of the quantizer of the first sigma-delta converter stage 1 that cannot be totally eliminated by the noise suppression logic 3. The level of the leak noise component in the output signal Y(z) primarily depends on two factors, namely the mismatch between the analog noise transfer function (NTF) of the first converter stage 1 and the NTF of the noise suppression logic 3 as well as the efficiency of quantization in the first converter stage 1. The NTF mismatch is largely dependent on the quality of the analog components used, while the level of quantization noise of the first converter stage 1 is inversely proportional to the square value of the resolution of the quantizer. As regards this aspect, it is therefore desirable to obtain the highest possible quantization resolution in the first converter stage. By using 3-bit quantization in the first converter stage 1, an effective value for leak noise can be obtained for standard mismatch of the NTFs in the frequency band at issue here, which is approximately 100 dB lower than the effective value of a sinusoidal signal of maximum amplitude.

As mentioned previously, multi-bit sigma-delta converters have a disadvantage in that they are very sensitive to inaccuracies in the internal DA converter. By using what are known as DEM techniques (Dynamic Element Matching), however, these inaccuracies can be reduced to a certain degree. Nevertheless, DEM techniques give rise to additional delays in the feedback branch of the corresponding sigma-delta converter.

The architecture illustrated in FIG. 1 obviates the need for DEM techniques of this type because a sufficiently good match of the individual elements can be achieved using simple circuit features. Simulations have shown that a standard variance in the elements of the 3-bit DA converter less than 0.05% is sufficient to keep harmonic interference in the signal-to-noise ratio below −100 dB. 3-bit DA converters are preferably operated by what is known as the switched capacitor technique (SC technique), for which purpose seven standard capacitors are used. The SC technique is explained in detail in the publications mentioned above, "A 50 MHz Multibit Sigma-Delta Modulator for 12b 2 MHZ A/D Conversion", B. P. Brandt, B. A. Wolley, IEEE Journal of Solid-State Circuits, vol. 26, December 1991, and "A Cascaded Sigma-Delta Pipeline A/D Converter with 1.25 MHz Signal Bandwidth and 89 dB SNR", T. L. Brooks, D. H. Robertson, D. F. Kelly, A. Del Muro, S. W. Harston, IEEE Journal of Solid-State Circuits, vol. 32, pages 1896–1906, December 1997, and no further explanations to supplement those contained in these publications will be given here. The absolute value of the capacitors used determines the match properties and thermal noise induced. It has been found that for thermal noise, bigger capacitors are needed than would have to be used for element matching for the 0.6 μm standard CMOS process, which is preferably used. Generally speaking, sigma-delta converters which are operated with low oversampling require bigger capacitors in the input stage. Accordingly, good matching is also achieved without the need to use DEM techniques.

All analog elements of the sigma-delta converter are advantageously operated in a totally differential manner in accordance with SC technology. Preferably, a non-canonical structure may be selected, whereby the total capacity is doubled, but without making the signal independent of the charge applied by the internal reference voltage source. This is of particular advantage because the internal reference voltage source is an extremely sensitive component of the sigma-delta converter. As a rule, the amplification factors $b_1$ and $b_3$ mentioned above and given in FIG. 1 are selected as one (1). However, the amplification factor $b_1$ may also be selected so as to scale the input range of the sigma-delta converter to not equal to one (1), for which the non-canonical structure is needed. For the less critical second sigma-delta converter stage 2, it is preferable to use a canonical structure, as described in the aforementioned publication "A Cascaded Sigma-Delta Pipeline A/D Converter with 1.25 MHz Signal Bandwidth and 89 dB SNR", T. L. Brooks, D. H. Robertson, D. F. Kelly, A. Del Muro, S. W. Harston, IEEE Journal of Solid-State Circuits, vol. 32, pages 1896–1906, December 1997.

For all SC integrators 6, 9 and 20, it is preferable to use the same transconductance amplifier with a transition frequency of 150 MHz and direct current amplification of 80 dB. The individual flash AD converters 10 and 21 are also preferably operated on a fully differential basis in accordance with SC technology, for which purpose a single-stage comparator can be used.

Figure 4:
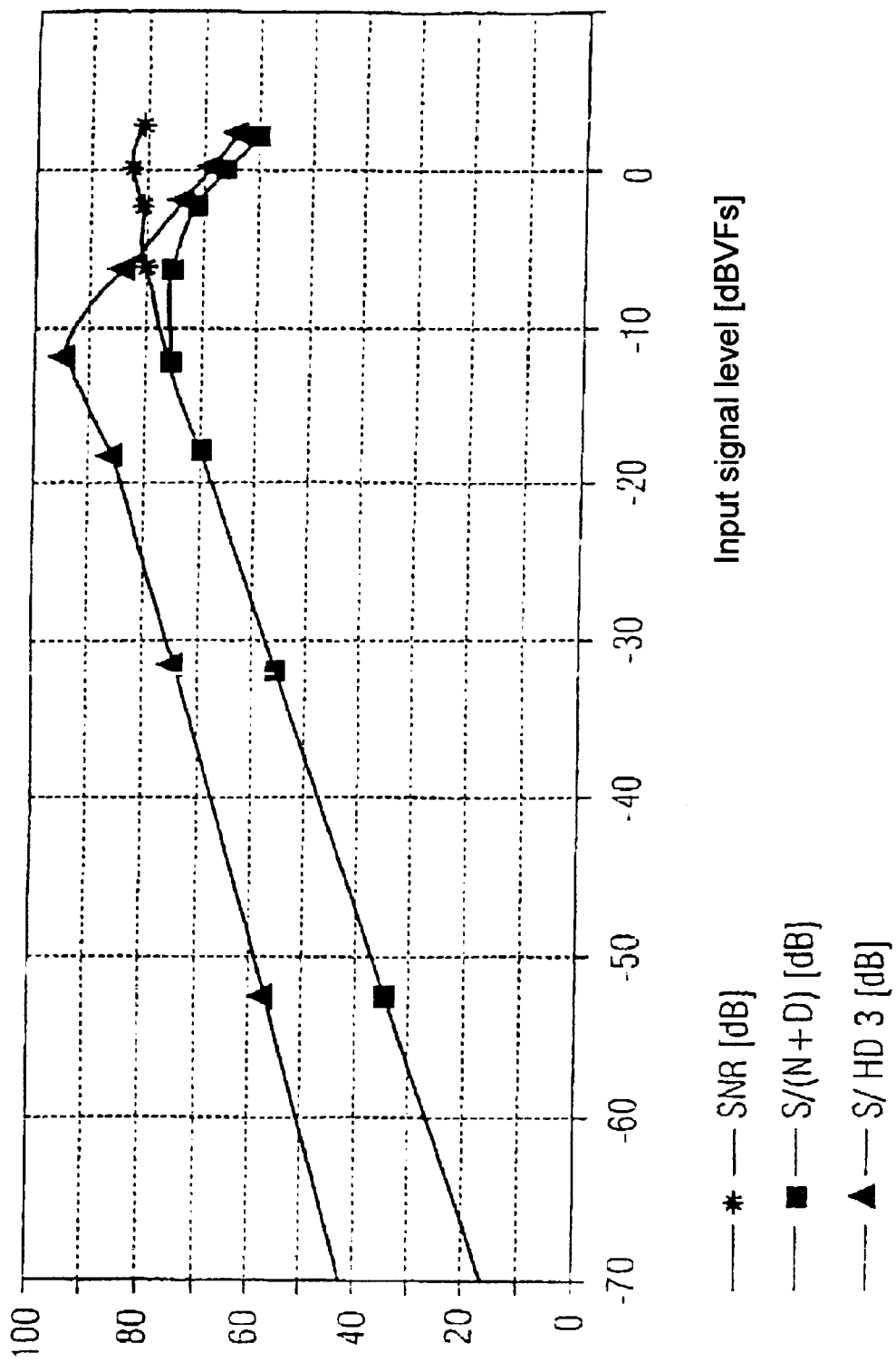
FIG. 4 is a graph plotting signals to highlight the performance of the architecture illustrated in FIG. 1.

FIG. 3 and FIG. 4 set out measurement data for the sigma-delta analog-to-digital converter illustrated in FIG. 1 at a sampling frequency of 10 MHz and for an input signal frequency of 100 kHz.

FIG. 3 gives the logarithmically applied output spectrum for a sinusoidal input signal with an amplitude of 2 Vpp (−6 dB). At low frequencies, white noise is dominant. At higher frequencies, in particular above the vertical line indicated at 420 kHz, which corresponds to the frequency band of interest in this particular case at 12-times oversampling (OSR=12), the quantization noise becomes dominant. The third order harmonic distortion (HD3) is −81 dB.

FIG. 4 gives the ratio of the signal level to the noise and distortion level (S/(N+D)) and the ratio of the signal level to the level of third order harmonic distortion (S/HD3) for different input signal amplitudes of the signal-to-noise ratio (SNR). The value S/HD3 reaches its maximum value of 94 dB at an input signal level of −12 dB, while the value SNR reaches its maximum value of 83 dB at an input signal level of 0 dB.

The two sigma-delta converter stages 1, 2 illustrated in FIG. 1, together with an additional active anti-alias filter, which serves as a preliminary filter for operating the sigma-delta converter, and the reference voltage sources needed for SC operation, are preferably arranged on one chip while the noise suppression logic 3 may also be provided externally, separate therefrom or arranged on the chip.

The sigma-delta converter array proposed above according to the teachings of the invention is a multi-stage (e.g., two-stage) system and uses multi-bit quantization in both the first sigma-delta converter stage and in the second sigma-delta converter stage. Until now, the idea of using multi-bit quantization in the first sigma-delta converter stage as well has been unknown in sigma-delta converter architectures with two or more sigma-delta converter stages connected in a cascaded array.

The entire sigma-delta converter array can, therefore, also be configured in the form of third order sigma-delta modulators or higher without impairing the system stability, which also means that effective operation in terms of junction surface area is possible along with low current or energy consumption.

Furthermore, by using a multi-stage sigma-delta converter, the desired quantization resolution is divided between the individual multi-bit converter stages. The quantization resolution attained by the sigma-delta converter architecture as a whole is calculated on the basis of [quantization width of the first stage+quantization width of the second stage] −1.

The resolution of the first converter stage and the resolution of the second converter stage are respectively incorporated in the output signal of the sigma-delta converter array so that a sigma-delta converter array of any order can be optimized to attain a compromise between energy consumption on the one hand and the requisite silicon junction on the other. The invention offers particular advantages in applications which require low current consumption and high resolution and can therefore be used in BQAP, ISDN, ADSL, HDSL or general xDSL applications and in cordless telephones, amongst others, for example.

Replacing the known one-bit quantization of the first sigma-delta converter stage with multi-bit quantization achieves better resolution and reduced sensitivity to leak. Furthermore, the number of parameters which can be used to optimize a multi-bit sigma-delta converter architecture is greater. The multi-bit sigma-delta converter architecture proposed by the-teachings of the invention guarantees high performance even without using DEM techniques (Dynamic Element Matching) or any other techniques to improve internal DA converter performance.

The architecture currently proposed is configured so as to obtain a digital output signal that corresponds to the output signal of a third order 7-bit sigma-delta converter. To this end, the first sigma-delta converter stage may be a second order 3-bit sigma-delta converter while the second sigma-delta converter stage may advantageously be a first order 5-bit sigma-delta converter.

The foregoing description has been presented for the purposes of illustration and description. It is not intended to be exhaustive or to limit the teaching of the invention to the embodiments disclosed. Many modifications and variations are possible in light of the above teachings and it is intended that the scope of the invention be limited not by this detailed description, but rather by the claims appended hereto.

What is claimed is:

1. A sigma-delta analog-to-digital converter array, comprising:
    at least two sigma-delta converter stages each comprising an analog-to-digital (A/D) converter disposed in a forward path of the sigma-delta converter stage and at least one digital-to-analog (D/A) converter arranged in a feedback path of the sigma-delta converter stage;
    the at least two sigma-delta converter stages connected in a cascaded array such that an analog input signal to be converted into a digital output signal is applied to an input of a first sigma-delta converter stage of the at least two sigma-delta converter stages; and an analog differential signal corresponding to a difference between a digital-to-analog-converted output signal of the analog-to-digital converter of the first sigma-delta converter and an input signal to the analog-to-digital converter stage of the first sigma-delta converter stage is input to a second sigma-delta converter stage of the at least two sigma-delta converter stages; and
    the digital output signal corresponding to the analog input signal, wherein the digital output signal is obtained by combining the output signals of the respective analog-to-digital converters of the at least two sigma-delta converter stages;
    wherein the analog-to-digital converter of the first sigma-delta converter stage is a multi-bit analog-to-digital converter and the at least one digital-to-analog converter of the first sigma-delta converter stage is a multi-bit digital-to-analog converter; the analog-to-digital converter of the second sigma-delta converter stage is a multi-bit analog-to-digital converter and the at least one digital-to-analog converter of the second sigma-delta converter stage is a multi-bit digital-to-analog converter; and the sigma-delta analog-to-digital converter array is configured as a third order sigma-delta analog-to-digital converter.

2. The sigma-delta analog-to-digital converter array as claimed in claim 1, wherein the first sigma-delta converter stage corresponds to a second order sigma-delta analog-to-digital converter.

3. The sigma-delta analog-to-digital converter array as claimed in claim 1, wherein the second sigma-delta converter stage corresponds to a first order sigma-delta analog-to-digital converter.

4. The sigma-delta analog-to-digital converter array as claimed in claim 1, wherein a bit width of the analog-to-digital converters and digital-to-analog converters of the at least two sigma-delta converter stages are selected such that the digital output signal obtained by combining the digital output signals of the two sigma-delta converter stages corresponds to the digital output signal of a sigma-delta converter with 7-bit quantization.

5. The sigma-delta analog-to-digital converter array as claimed in claim 1, wherein the analog-to-digital converter of the second sigma-delta converter stage is a 5-bit analog-to-digital converter and the at least one digital-to-analog converter of the second sigma-delta converter stage is a 5-bit digital-to-analog converter.

6. The sigma-delta analog-to-digital converter array as claimed in claim 1, wherein the analog-to-digital converter of the first sigma-delta converter stage is a 3-bit analog-to-digital converter and the at least one digital-to-analog converter of the first sigma-delta converter stage is a 3-bit digital-to-analog converter.

7. The sigma-delta analog-to-digital converter array as claimed in claim 1, further comprising:
a noise suppression circuit that is configured to receive digital output signals of the at least two sigma-delta converter stages and determine and output the digital output signal by combining the digital output signals of the at least two sigma-delta converter stages.

8. The sigma-delta analog-to-digital converter array as claimed in claim 7, wherein the noise suppression circuit includes:
a delay circuit; and
a digital filter circuit,
wherein the digital output signal of the first sigma-delta converter stage is applied to the delay circuit, and the digital output signal of the second sigma-delta converter stage is applied to the digital filter circuit; and
wherein the noise suppression circuit outputs a difference between an output signal of the delay circuit and an output signal of the digital filter circuit as the digital output signal.

9. The sigma-delta analog-to-digital converter array as claimed in claim 1, the at least two sigma-delta converter stages are arranged on a chip constructed in accordance with a 0.6 $\mu$m-CMOS process.

10. The sigma-delta analog-to-digital converter array as claimed in claim 1, wherein the analog-to-digital converter of each of the at least two sigma-delta converter stages is a flash converter.

11. The sigma-delta analog-to-digital converter array as claimed in claim 1, wherein the at least two sigma-delta converter stages are operated using a switched capacitor technique.

12. The sigma-delta analog-to-digital converter array as claimed in claim 11, wherein the first sigma-delta converter stage is configured as a non-canonical switched-capacitor structure and the second sigma-delta converter stage is configured as a canonical switched-capacitor structure.

13. Sigma-delta analog-to-digital converter array as claimed in claim 12, wherein the first sigma-delta converter stage is designed as a non-canonical switched-capacitor structure and the second sigma-delta converter stage is designed as a canonical switched-capacitor structure.

* * * * *